United States Patent
Okada et al.

(10) Patent No.: US 8,599,346 B2
(45) Date of Patent: Dec. 3, 2013

(54) IMAGE DISPLAY DEVICE AND MANUFACTURING METHOD THEREOF

(75) Inventors: Naoya Okada, Chiba (JP); Takashi Hattori, Musashimurayama (JP); Takahide Kuranaga, Mobara (JP); Mutsuko Hatano, Kokubunji (JP)

(73) Assignees: Japan Display Inc., Tokyo (JP); Panasonic Liquid Crystal Display Co., Ltd., Hyogo-ken (JP)

( * ) Notice: Subject to any disclaimer, the term of this patent is extended or adjusted under 35 U.S.C. 154(b) by 180 days.

(21) Appl. No.: 12/938,524

(22) Filed: Nov. 3, 2010

(65) Prior Publication Data

US 2011/0102700 A1 May 5, 2011

(30) Foreign Application Priority Data

Nov. 4, 2009 (JP) ................................. 2009-253205

(51) Int. Cl.
*G02F 1/1333* (2006.01)
*G02F 1/136* (2006.01)

(52) U.S. Cl.
USPC ............................................ 349/138; 349/43

(58) Field of Classification Search
USPC ........................... 349/41–43, 138; 257/59, 72
See application file for complete search history.

(56) References Cited

U.S. PATENT DOCUMENTS

| | | | |
|---|---|---|---|
| 6,532,050 B1 * | 3/2003 | Kim et al. | 349/43 |
| 7,256,534 B2 * | 8/2007 | Koo et al. | 257/59 |
| 7,787,065 B2 * | 8/2010 | Lee et al. | 349/42 |
| 2006/0160912 A1 * | 7/2006 | Sasaki et al. | 521/170 |

FOREIGN PATENT DOCUMENTS

JP  2005-254541  9/2005

* cited by examiner

*Primary Examiner* — Dung Nguyen
(74) *Attorney, Agent, or Firm* — Antonelli, Terry, Stout & Kraus, LLP.

(57) ABSTRACT

Provided is an image display device including: a resin member; a TFT circuit layer formed above the resin member; and an inorganic film formed on a surface of the resin member to be formed between the resin member and the TFT circuit layer, in which the inorganic film has a stress acting thereon, the stress being, at a glass transition point (Tg) of the resin member, in the range of equal to or higher than −300 MPa to equal to or lower than 200 MPa, while, at a room temperature, in the range of equal to or higher than −400 MPa to equal to or lower than 50 MPa.

6 Claims, 11 Drawing Sheets

300

400

IMAGE DISPLAY DEVICE AND MANUFACTURING METHOD THEREOF

CROSS-REFERENCE TO RELATED APPLICATION

The present application claims priority from Japanese application JP 2009-253205 filed on Nov. 4, 2009, the content of which is hereby incorporated by reference into this application.

BACKGROUND OF THE INVENTION

1. Field of the Invention

The present invention relates to an image display device and a manufacturing method therefor.

2. Description of the Related Art

Generally, for example, an image display device including a flexible resin substrate is more light in weight and has excellent impact resistance and flexibility compared with an image display device including a glass substrate.

In a case where such an image display device is, for example, a liquid crystal display device, the image display device includes a pair of substrates sandwiching liquid crystal therebetween, and each of the substrates is formed of a resin substrate. In this case, on a surface of one resin substrate on the liquid crystal side, a conductive film, a semiconductor film, an insulating film, and the like which are patterned are laminated in a predetermined order, to thereby form a laminate including a gate signal line, a drain signal line, a thin-film transistor, a pixel electrode, and the like. Note that, in this specification, in some cases, the laminate is referred to as thin-film transistor (TFT) circuit layer.

Further, as for the liquid crystal display device having such a structure, there is known a type in which a buffer layer is formed between the resin substrate and the TFT circuit layer. In a case where the liquid crystal display device (image display device) is formed by a transfer method in which a glass substrate is first used as a temporary substrate, the buffer layer has been used so as to prevent impurities in the glass substrate from penetrating into the TFT circuit layer. Further, in a case where the liquid crystal display device (image display device) is formed by a direct formation method in which the TFT circuit layer is formed directly on the resin substrate, the buffer layer has been used so as to enhance adhesion between the resin substrate and a metal layer (for example, gate signal line) which is the lowermost layer of the TFT circuit layer. For example, a dense film such as a silicon nitride film may be used as the buffer layer (JP 2005-254541 A).

SUMMARY OF THE INVENTION

However, it is found that a crack or a wrinkle is generated in the buffer layer in a stage of forming the buffer layer on an upper surface of a resin member such as the resin substrate or a resin layer.

As a result of a thorough investigation into the causes of the defects, the inventors of the present invention found out the following facts. That is, so far, a temperature when the buffer layer is formed has been set to a temperature which is equal to or higher than a glass transition point (Tg) of a resin forming the resin member (resin substrate or resin layer). When the temperature of the resin member is equal to or lower than the glass transition point (Tg) thereof, the resin member has a high mechanical strength, and hence deformation of the buffer layer may be prevented with respect to a stress acting on the buffer layer formed on the upper surface of the resin member. However, when the temperature of the resin member exceeds Tg, and the resin member is softened to become a rubbery state, the mechanical strength of the resin member is lowered, and hence deformation of the buffer layer occurs so as to release the stress acting on the buffer layer. When the stress is a tensile stress, force acts on the buffer layer in a direction to contract the buffer layer, and hence a crack is generated in the buffer layer because the resin member cannot follow the contraction of the buffer layer. On the other hand, when the stress is a compressive stress, force acts on the buffer layer in a direction to expand the buffer layer, and hence a wrinkle is generated in the buffer layer accompanying the softening of the resin member. When a crack or a wrinkle is generated in the buffer layer, there is a risk that reliability of the TFT circuit layer formed on the buffer layer is lowered.

Further, when a crack or a wrinkle is generated in an inorganic film IOL formed on the upper surface of the resin member, a crack or a wrinkle is also generated in a buffer layer BFL formed on an upper surface of the inorganic film IOL, and as a result, there is a risk that reliability of the TFT circuit layer formed on the buffer layer is lowered.

The present invention provides an image display device including a TFT circuit layer which is excellent in reliability.

Further, the present invent ion provides a manufacturing method for an image display device, which is capable of forming a TFT circuit layer which is excellent in reliability.

An image display device according to an aspect of the present invention includes:

a resin member;

a TFT circuit layer formed above the resin member; and an inorganic film formed on a surface of the resin member to be formed between the resin member and the TFT circuit layer, in which the inorganic film has a stress acting thereon, the stress being, at a glass transition point (Tg) of the resin member, in the range of equal to or higher than −300 MPa to equal to or lower than 200 MPa, while, at a room temperature, in the range of equal to or higher than −400 MPa to equal to or lower than 50 MPa.

In the present invention, the term "resin member" is a concept encompassing a resin substrate and a resin layer. That is, the "resin member" may be a resin substrate or a resin layer. Note that, in the present invention, the "resin substrate" refers to a substrate formed of a resin, and the "resin layer" refers to a layer formed of a resin, which is formed on a substrate.

In the image display device, the inorganic film may include a film selected from the group consisting of a silicon oxynitride film, a silicon oxide film, a silicon nitride film, a metal film, a semi-metal film, a metal oxynitride film, a metal oxide film, and a metal nitride film, or a laminate thereof.

In the image display device, the room temperature may be a temperature in a range of 20° C. to 80° C.

The image display device may further include a buffer layer formed between the inorganic film and the TFT circuit layer.

The image display device may be a liquid crystal display device.

The image display device may be an organic EL display device.

A manufacturing method for an image display device according to another aspect of the present invention includes:

forming an inorganic film on a surface of a resin member at a temperature which is equal to or higher than a room temperature and which is equal to or lower than a glass transition point (Tg) of the resin member; and forming a TFT circuit layer above the inorganic film at a temperature which is equal to or higher than the glass transition point (Tg) of the resin member.

In the manufacturing method for an image display device, the forming an inorganic film may include forming a film selected from the group consisting of a silicon oxynitride film, a silicon oxide film, a silicon nitride film, a metal film, a semi-metal film, a metal oxynitride film, a metal oxide film, and a metal nitride film, or a laminate thereof.

In the manufacturing method for an image display device, the forming an inorganic film may include forming an inorganic film by at least one method selected from the group consisting of a CVD method, a sputtering method, and an evaporation method.

In the manufacturing method for an image display device, the room temperature may be a temperature in a range of 20° C. to 80° C.

The manufacturing method for an image display device may further include forming a buffer layer on the inorganic film, after the forming an inorganic film and before the forming a TFT circuit layer.

In the manufacturing method for an image display device, the image display device may be a liquid crystal display device.

In the manufacturing method for an image display device, the image display device may be an organic EL display device.

Note that, the above-mentioned structures are given as a mere example, and hence the present invention may be appropriately modified within the scope that does not depart from the technical idea thereof. Further, an example of the structure of the present invention other than the above-mentioned structures is made apparent from an overall description in the specification of the present application or from the accompanying drawings.

According to the image display device described above, the inorganic film is formed on the surface of the resin member to be formed between the resin member and the TFT circuit layer. Therefore, a crack or a wrinkle is prevented from being generated in the inorganic film, and hence the TFT circuit layer may be excellent in reliability.

Further, the manufacturing method for an image display device described above includes the steps of forming the inorganic film on the surface of the resin member at the temperature which is equal to or higher than the room temperature and which is equal to or lower than the glass transition point (Tg) of the resin member and forming the TFT circuit layer above the inorganic film at the temperature which is equal to or higher than the glass transition point (Tg) of the resin member. Therefore, a crack or a wrinkle is prevented from being generated in the inorganic film, and hence the TFT circuit layer may be formed to be excellent in reliability.

Other effects of the present invention may be made apparent from the entire description in the specification.

DETAILED DESCRIPTION OF THE INVENTION

Figure 1:
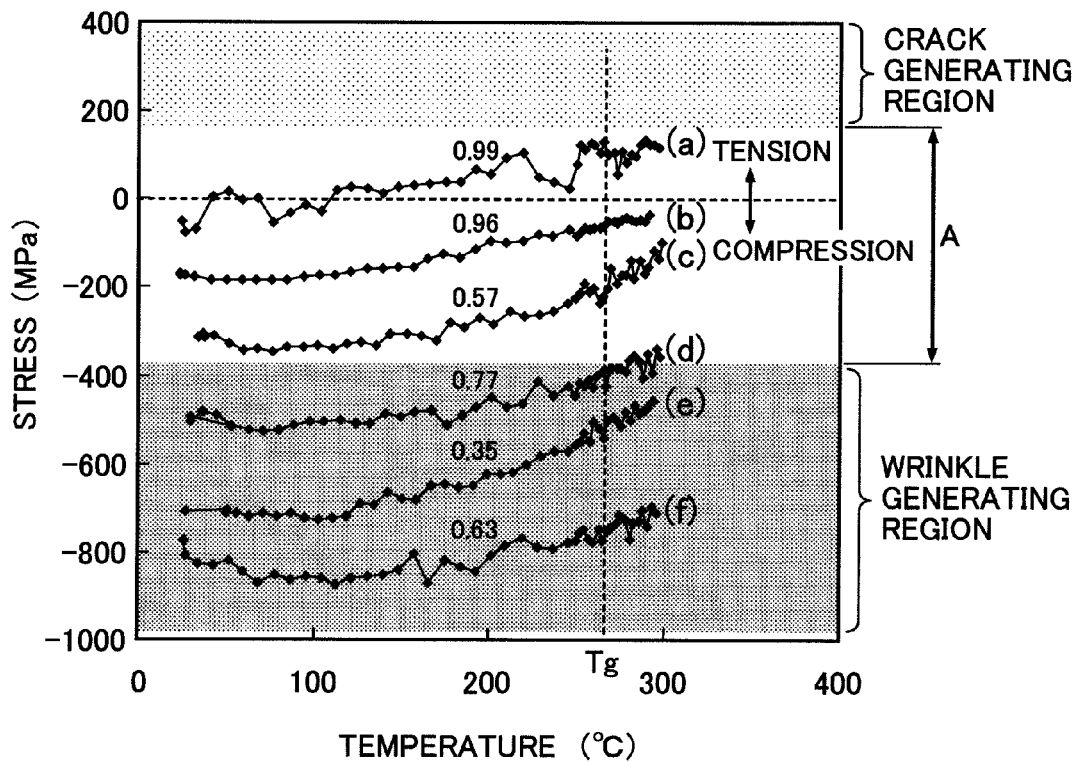
FIG. 1 is a graph showing characteristics of an inorganic film included in an image display device according to a first embodiment of the present invention.

Hereinafter, an image display device and a manufacturing method therefor according to embodiments of the present invention are described with reference to the accompanying drawings. Note that, the same or similar components are denoted by the same reference symbols in the drawings and the embodiments, and the overlapping description thereof is omitted.

Figure 2:
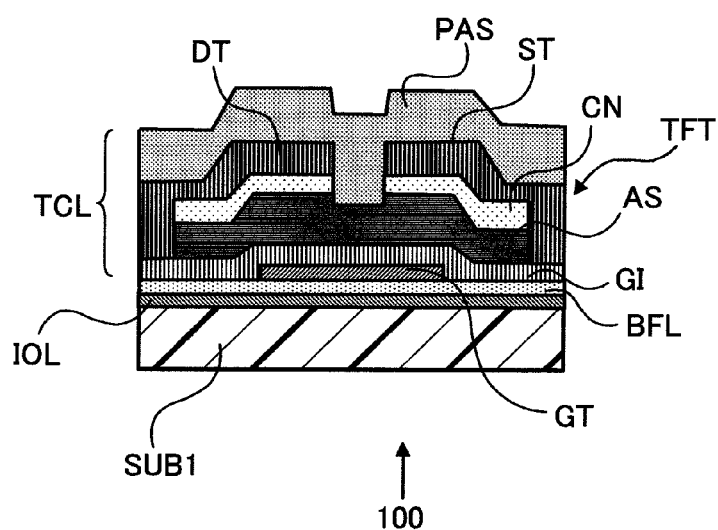
FIG. 2 is a cross-sectional view illustrating a principal part of the image display device according to the first embodiment of the present invention.

1. First Embodiment 1.1. Structure of Principal Part of Image Display Device FIG. 2 is a cross-sectional view illustrating a principal part of an image display device (liquid crystal display device 100) according to a first embodiment of the present invention. FIG. 2 illustrates, out of a pair of substrates of the liquid crystal display device 100, which are opposed to each other with liquid crystal being sandwiched therebetween, a substrate (denoted by reference symbol SUB1 in FIG. 2) on which thin-film transistors TFTs are formed. FIG. 2 illustrates a cross-section of a surface including the thin-film transistor TFT (cutting plane of the substrate SUB1, which is perpendicular to a surface on which an inorganic film IOL is formed).

In the liquid crystal display device 100 illustrated in FIG. 2, the substrate SUB1 (resin member) is a resin substrate formed of, for example, a resin (plastic). Although not illustrated in FIG. 2, another substrate SUB2 (resin member) (see FIG. 15), which is opposed to the substrate SUB1 with liquid crystal being sandwiched therebetween, is also a resin substrate formed of, for example, a resin (plastic). The liquid crystal display device 100 illustrated in FIG. 2 is a so-called flexible display device. Note that, instead of each of the substrate SUB1 and the substrate SUB2, there may be used a substrate in which a resin layer is formed on a surface of a flexible substrate which is formed of a material other than resin.

On a surface of the substrate SUB1 on the liquid crystal side, the inorganic film IOL is formed. The inorganic film IOL is a film selected from the group consisting of, for example, a silicon oxynitride film, a silicon oxide film, and a silicon nitride film, or a laminate thereof. However, the inorganic film IOL is not limited to be formed of those films, and may be formed of a film selected from the group consisting of, in addition to the films exemplified above, for example, a metal film, a semi-metal film, a metal oxynitride film, a metal oxide film, and a metal nitride film, or a laminate thereof.

The inorganic film IOL is formed so as to reliably form a TFT circuit layer TCL above the inorganic film IOL. Therefore, the inorganic film IOL is preferred not to have a crack or a wrinkle formed therein. Note that, in the present invention, the fact "a crack or a wrinkle is not generated in an inorganic film or a buffer layer" may be confirmed by, for example, an optical microscope, an atomic force microscope, or a scanning electron microscope. A stress acting on the inorganic film IOL is, at a glass transition point Tg of the substrate SUB1, in the range of equal to or higher than −300 MPa to equal to or lower than 200 MPa, while, at a room temperature (20° C. to 80° C.), in the range of equal to or higher than −400 MPa to equal to or lower than 50 MPa. The inorganic film IOL is further described in detail later.

On an upper surface of the inorganic film IOL, a buffer layer BFL formed of, for example, a silicon nitride film is formed. On an upper surface of the buffer layer BFL, the TFT circuit layer TCL is formed. For example, the buffer layer BFL is formed so as to improve adhesion between the substrate SUB1 and a gate signal line (gate electrode GT) described later. Therefore, the buffer layer BFL is preferred to be formed of a dense layer. The TFT circuit layer TCL includes, in addition to a thin-film transistor TFT illustrated in FIG. 2, the gate signal line (not shown) connected to the gate electrode GT for driving the thin-film transistor TFT, a drain signal line (not shown) connected to a drain electrode DT of the thin-film transistor TFT, and a pixel electrode (not shown) connected to a source electrode ST of the thin-film transistor TFT. In order to form the thin-film transistor TFT, the respective signal lines, and the electrode, a conductive film, a semiconductor film, and an insulating film which are patterned are laminated in a predetermined order. That is, the thin-film transistor TFT illustrated in FIG. 2 includes the gate electrode GT formed on the buffer layer BFL, a gate insulating film GI formed so as to cover the gate electrode GT, a semiconductor layer AS formed of, for example, amorphous silicon, which is formed on the gate insulating film GI so as to overlap the gate electrode GT, and the drain electrode DT and the source electrode ST which are formed on the semiconductor layer AS so as to be opposed to each other. Note that, contact layers CN formed of, for example, an n-type high concentration amorphous silicon are formed between the drain electrode DT and the semiconductor layer AS and between the source electrode ST and the semiconductor layer AS, respectively. The thin-film transistor TFT is covered with a protective film PAS formed of, for example, a silicon nitride film. Further, the thin-film transistor TFT illustrated in FIG. 2 is a bottom-gate thin-film transistor in which the gate electrode GT is formed in a layer below the semiconductor layer AS. However, the present invention is not limited thereto, and the thin-film transistor TFT may be a top-gate thin-film transistor in which the gate electrode GT is formed in a layer above the semiconductor layer AS.

1.2. Manufacturing Method for Image Display Device

Next, a manufacturing method for the image display device according to this embodiment illustrated in FIG. 2 is described with reference to cross-sectional views illustrated in association with FIG. 2. The image display device illustrated in FIG. 2 may be manufactured by, roughly, for example, any one of the following methods, that is, a transfer method (first manufacturing method) illustrated in FIGS. 3 to 8 and a direct formation method (second manufacturing method) illustrated in FIGS. 9 and 10. The present invention is applicable to any one of the methods.

1.2.1. First Manufacturing Method (Transfer Method)

First, the transfer method is described below.

1.2.1-1. Step 1 (FIG. 3)

Figure 3:
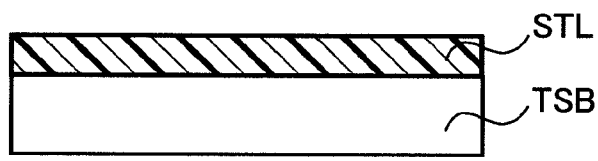
FIG. 3 is a cross-sectional view illustrating a step of a first manufacturing method for the image display device illustrated in FIG. 2, and illustrates a series of steps together with FIGS. 4 to 8.

As illustrated in FIG. 3, a temporary substrate TSB formed of glass is prepared. On a surface of the temporary substrate TSB, a release film STL formed of a resin is formed. The release film STL is a film necessary for separating the TFT circuit layer TCL formed on the upper surface of the release film STL from the temporary substrate TSB in a step described later. The release film STL is formed of, for example, polybenzoxazole, polyamideimide having an alicyclic structure, or polyimide having an alicyclic structure. The release film STL formed of a resin is adhered to the resin substrate SUB1 in a step described later, and serves as a part of the resin substrate SUB1.

1.2.1-2. Step 2 (FIG. 4)

Figure 4:
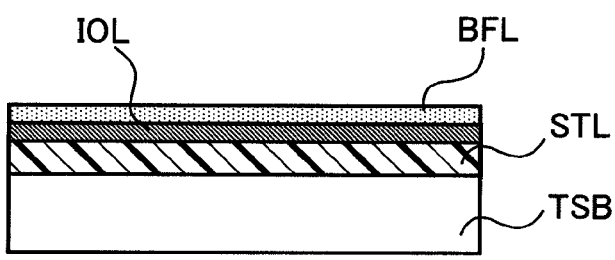
FIG. 4 is a cross-sectional view illustrating a step of the first manufacturing method for the image display device illustrated in FIG. 2, and illustrates the series of steps together with FIG. 3 and FIGS. 5 to 8.

Next, as illustrated in FIG. 4, the inorganic film IOL is formed on an upper surface of the release film STL. The inorganic film IOL may be formed by at least one method selected from the group consisting of a CVD method, a sputtering method, and an evaporation method. The inorganic film IOL may be formed of a film selected from the group consisting of, for example, a silicon oxynitride film, a silicon oxide film, a silicon nitride film, a metal film, a semi-metal film, a metal oxynitride film, a metal oxide film, and a metal nitride film, or a laminate thereof. Note that, the inorganic film IOL is formed at a temperature in a range of, for example, a room temperature (for example, 25° C.) to a temperature equal to or lower than a glass transition point (Tg) of the release film STL. In this condition, the inorganic film IOL is formedwithout a crack or a wrinkle being generated. The inorganic film IOL is described in detail below.

Further, as illustrated in FIG. 4, the buffer layer BFL is formed on an upper surface of the inorganic film IOL. The buffer layer BFL is formed so as to, for example, prevent impurities in the temporary substrate TSB from penetrating into the TFT circuit layer TCL described later. The buffer layer BFL may be formed of, for example, a dense silicon nitride film. In this case, with the existence of the inorganic film IOL, the buffer layer BFL may be formed without a crack or a wrinkle being generated. Note that, the buffer layer BFL is preferred to be formed at a temperature which is equal to or higher than the room temperature and which is lower than Tg of the resin substrate SUB1. As described above, by forming the buffer layer BFL at the temperature which is equal to or higher than the room temperature and which is lower than Tg of the resin substrate SUB1, deformation of the resin substrate SUB1 may be prevented to reduce a stress to be generated on the resin substrate SUB1. Therefore, a crack or a wrinkle may be prevented from being generated in the buffer layer BFL.

1.2.1-3. Step 3 (FIG. 5)

Figure 5:
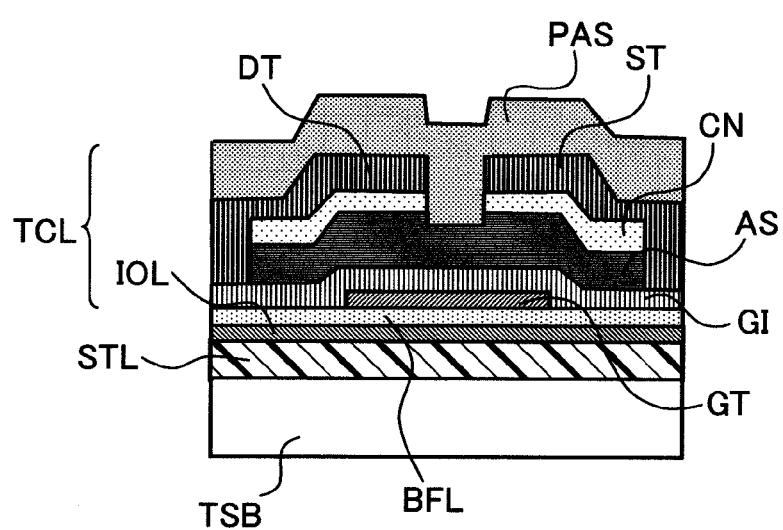
FIG. 5 is a cross-sectional view illustrating a step of the first manufacturing method for the image display device illustrated in FIG. 2, and illustrates the series of steps together with FIGS. 3 and 4 and FIGS. 6 to 8.

Next, as illustrated in FIG. 5, the TFT circuit layer TCL is formed on an upper surface of the buffer layer BFL. The TFT circuit layer TCL is formed by laminating, for example, the gate electrode GT, the gate insulating film GI, the semiconductor layer AS, the contact layer CN, the drain electrode DT and the source electrode ST, and the protective film PAS in the stated order. The gate electrode GT is formed as a part of the gate signal line (not shown), the drain electrode DT is connected to the drain signal line (not shown), and the source electrode ST is connected to the pixel electrode (not shown). Note that, the TFT circuit layer TCL may be formed at a process temperature which is equal to or higher than the glass transition point (Tg) of the release film STL, and hence the reliability of the TFT circuit layer TCL may be ensured.

1.2.1-4. Step 4 (FIG. 6)

Figure 6:
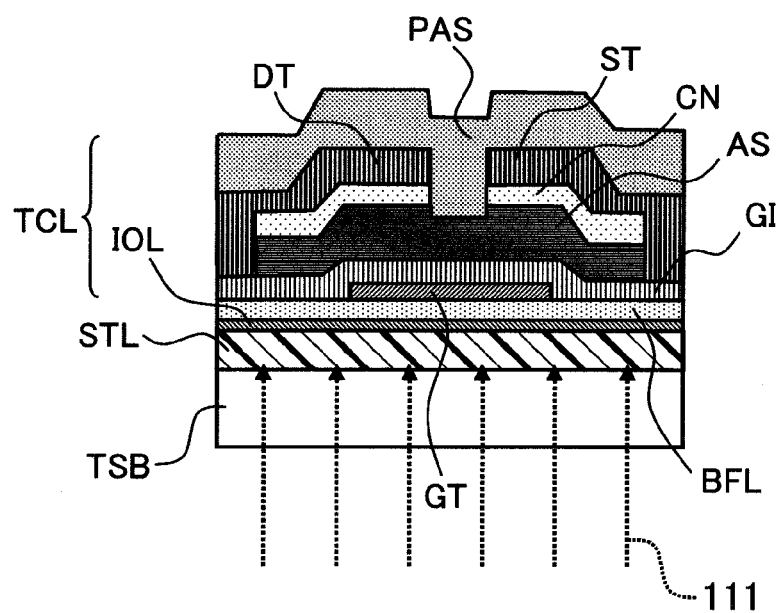
FIG. 6 is a cross-sectional view illustrating a step of the first manufacturing method for the image display device illustrated in FIG. 2, and illustrates the series of steps together with FIGS. 3 to 5 and FIGS. 7 and 8.

Next, as illustrated in FIG. 6, a surface of the temporary substrate TSB, on a side opposed to the side on which the TFT circuit layer TCL is formed, is irradiated with ultraviolet (UV) light (for example, UV laser light or UV lamp light) 111 (illustrated by arrows in FIG. 6).

Figure 7:
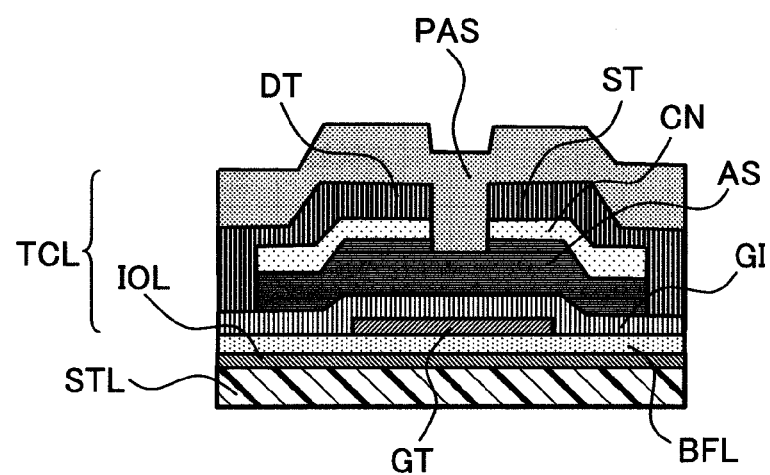
FIG. 7 is a cross-sectional view illustrating a step of the first manufacturing method for the image display device illustrated in FIG. 2, and illustrates the series of steps together with FIGS. 3 to 6 and FIG. 8.

1.2.1-5. Step 5 (FIG. 7)

The UV light 111 passes through the temporary substrate TSB, and then enters the release film STL. Material change occurs in the release film STL due to this UV light 111, and hence adhesion of the release film STL to the temporary substrate TSB is lowered. As a result, as illustrated in FIG. 7, the temporary substrate TSB may be separated from the release film STL.

1.2.1-6. Step 6 (FIG. 8)

Figure 8:
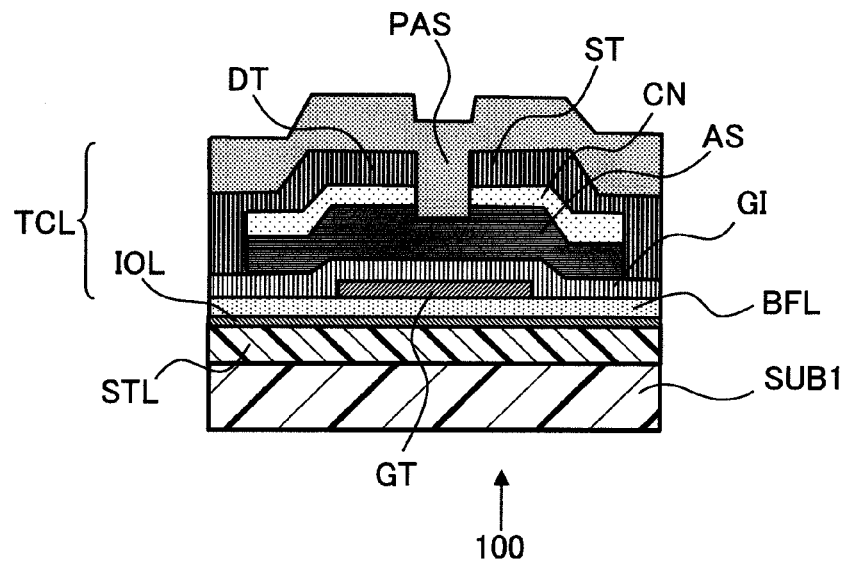
FIG. 8 is a cross-sectional view illustrating a step of the first manufacturing method for the image display device illustrated in FIG. 2, and illustrates the series of steps together with FIGS. 3 to 7.

Next, as illustrated in FIG. 8, a newly prepared substrate SUB1 formed of a resin is adhered on the surface of the release film STL from which the temporary substrate TSB has been separated. With this, as illustrated in FIG. 2, the image display device 100 which includes a TFT board including the substrate SUB1 formed of a resin may be obtained. Note that, in FIG. 2, the release film STL is not illustrated, but exists as a part of the substrate SUB1. That is, in this case, the substrate SUB1 formed of a resin may be recognized as a substrate formed of a resin including the release film STL.

1.2.2. Second Manufacturing Method (Direct Formation Method)

Next, the direct formation method is described below.

1.2.2-1. Step 1 (FIG. 9)

First, the resin substrate SUB1 is prepared. As illustrated in FIG. 9, the inorganic film IOL is formed on the upper surface of the resin substrate SUB1. The inorganic film IOL may be formed of a film selected from the group consisting of, for example, a silicon oxynitride film, a silicon oxide film, a silicon nitride film, a metal film, a semi-metal film, a metal oxynitride film, a metal oxide film, and a metal nitride film, or a laminate thereof. Note that, the inorganic film IOL is formed at a temperature in a range of, for example, a room temperature (for example, 25° C.) to a temperature equal to or lower than a glass transition point (Tg) of the resin substrate SUB1. The inorganic film IOL is described in detail below.

Figure 9:
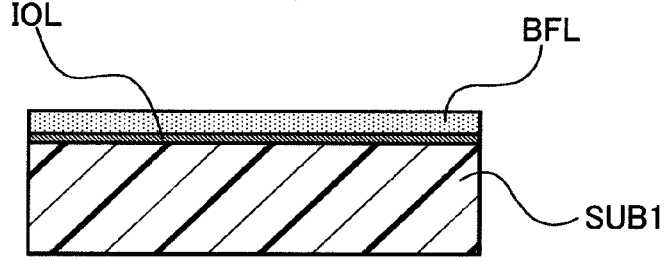
FIG. 9 is a cross-sectional view illustrating a step of a second manufacturing method for the image display device illustrated in FIG. 2, and illustrates a series of steps together with FIG. 10.

Next, as illustrated in FIG. 9, the buffer layer BFL is formed on the upper surface of the inorganic film IOL. The buffer layer BFL is formed so as to, for example, enhance adhesion between the resin substrate SUB1 and a metal layer (for example, gate signal line (not shown) connected to gate electrode GT) which is the lowermost layer of the TFT circuit layer TCL, the TFT circuit layer TCL being formed on the upper surface of the resin substrate SUB1. The buffer layer BFL is formed of, for example, a dense silicon nitride film. In this case, with the existence of the inorganic film IOL, the buffer layer BFL may be formed without a crack or a wrinkle being generated. Note that, the buffer layer BFL is preferred to be formed at a temperature which is equal to or higher than the room temperature and which is lower than Tg of the resin substrate SUB1. As described above, by forming the buffer layer BFL at the temperature which is equal to or higher than the room temperature and which is lower than Tg of the resin substrate SUB1, deformation of the resin substrate SUB1 may be prevented to reduce a stress to be generated on the resin substrate SUB1. Therefore, a crack or a wrinkle may be prevented from being generated in the buffer layer BFL.

Figure 10:
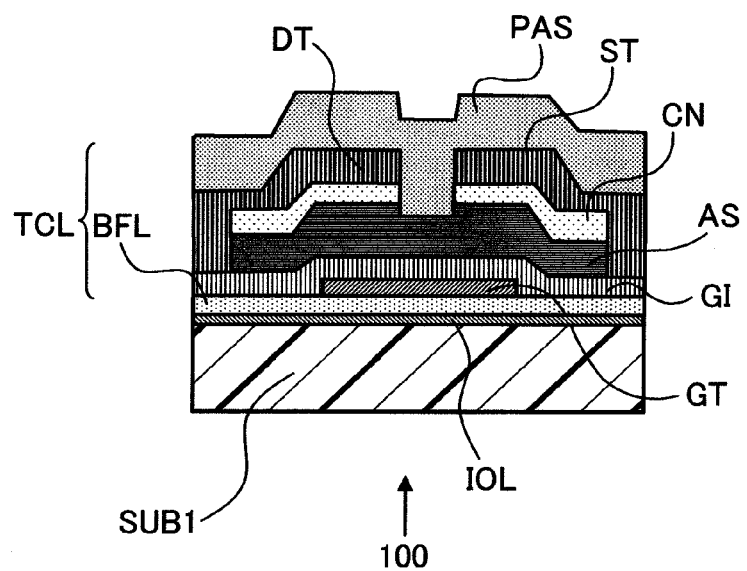
FIG. 10 is a cross-sectional view illustrating a step of the second manufacturing method for the image display device illustrated in FIG. 2, and illustrates the series of steps together with FIG. 9.

1.2.2-2. Step 2 (FIG. 10)

Next, the TFT circuit layer TCL is formed on the upper surface of the buffer layer BFL. The TFT circuit layer TCL is formed by laminating, for example, the gate electrode GT, the gate insulating film GI, the semiconductor layer AS, the contact layer CN, the drain electrode DT and the source electrode ST, and the protective film PAS in the stated order. The gate electrode GT is formed as a part of the gate signal line (not shown), the drain electrode DT is connected to the drain signal line (not shown), and the source electrode ST is connected to the pixel electrode (not shown). Note that, the TFT circuit layer TCL may be formed at a process temperature which is equal to or higher than the glass transition point (Tg) of the resin substrate SUB1, and hence the reliability of the TFT circuit layer TCL may be ensured.

1.3. Inorganic Film

Hereinafter, the inorganic film IOL illustrated in FIG. 2, FIGS. 3 to 8, and FIGS. 9 and 10 is described.

Figure 11:
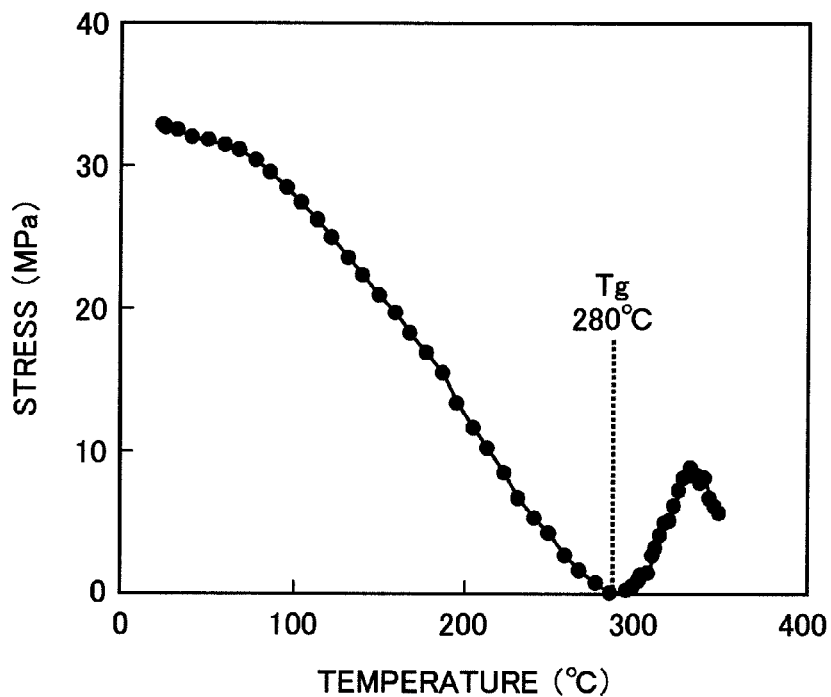
FIG. 11 is a graph showing a definition of a glass transition point of a resin forming a resin member included in the image display device according to the first embodiment of the present invention.

Here, before the description of the inorganic film IOL, a description is given of the glass transition point (Tg) of the resin member (resin substrate or resin layer) which is formed on the surface of the inorganic film IOL with reference to FIG. 11. FIG. 11 is a graph showing a relationship between a temperature (° C.) and a stress (MPa) in the resin member (resin substrate or resin layer). In FIG. 11, a resin forming the resin member may be, for example, polybenzoxazole (PBO). In FIG. 11, heat is applied to the resin member to increase the temperature thereof. The resin member becomes a rubbery state after the temperature thereof exceeds a border corresponding to a certain temperature (280° C. in FIG. 11). The temperature is defined as a glass transition point (Tg). Note that, the glass transition point Tg may be measured as, in a process of increasing the temperature, a temperature at which a minimum stress (closest to 0 Pa) acts on the resin member. That is, Tg of polybenzoxazole is 280° C. Note that, in FIG. 11, the case where a resin forming the resin member is polybenzoxazole is illustrated. As for the resin forming the resin member, Tg thereof is preferred to be, for example, in a range of 250° C. to 400° C. (for example, polyamideimide having alicyclic structure and polyimide having alicyclic structure).

Figure 12:
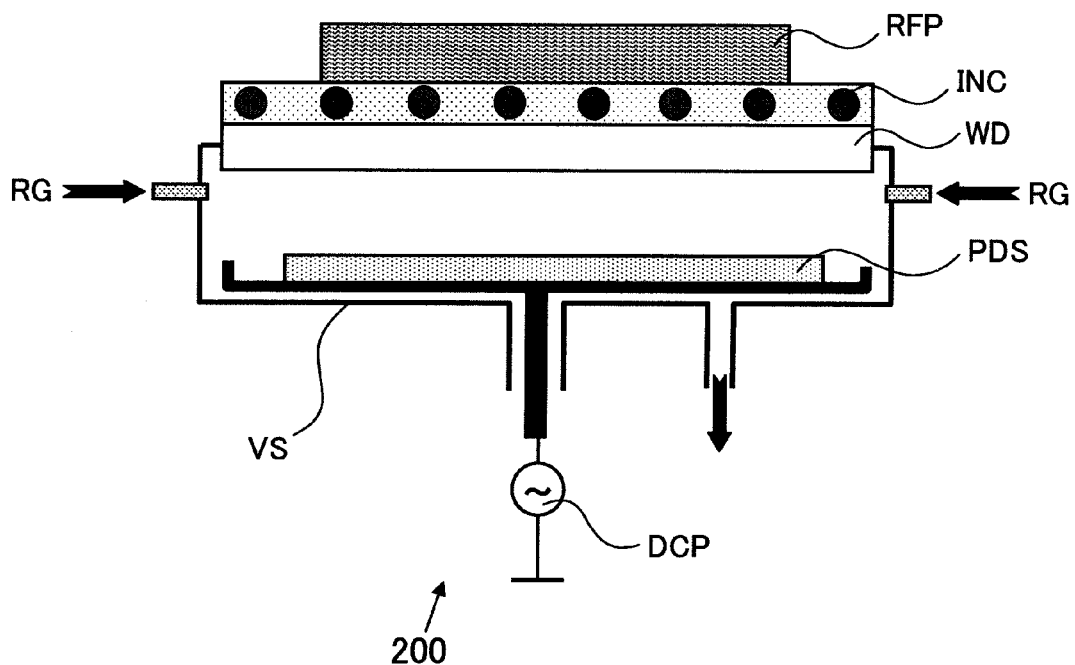
FIG. 12 illustrates an inductively coupled plasma chemical vapor deposition (CVD) apparatus, which is an example of an apparatus for forming the inorganic film included in the image display device according to the first embodiment of the present invention.

Further, FIG. 12 is a schematic structural view illustrating an apparatus (for example, inductively coupled plasma chemical vapor deposition (CVD) apparatus) 200 for forming the inorganic film IOL. FIG. 12 illustrates a chamber VS to which a reactive gas RG is supplied. In the chamber VS, a substrate (for example, temporary substrate TSB illustrated in FIG. 4) on which the inorganic film IOL is to be formed may be placed on a substrate pedestal PDS. The chamber VS includes an induction coil INC for generating plasma in the chamber VS, and a radio frequency window WD. The induction coil INC is driven by a radio frequency (RF) power supply (13.56 MHz) RFP. In the above-mentioned apparatus 200, a large number of excited species are generated by high-density plasma, which enables film formation at low temperature. When the inorganic film IOL is formed using the apparatus 200, a bias may be applied, if necessary, to the substrate pedestal PDS by a direct current (DC) power supply DCP. With this, ion irradiation may be controlled, and hence the inorganic film IOL may be formed with a stress acting thereon being adjusted.

Further, FIG. 1 is a graph showing a relationship between a temperature and a stress of the inorganic film IOL, the temperature being increased from a room temperature (here, the room temperature is assumed to be in a range of 20° C. to 80° C.) after the inorganic film IOL is formed on an upper surface of a substrate formed of silicon (Si) at the room temperature, the stress being generated on the inorganic film IOL when the temperature is increased. A horizontal axis represents the temperature (° C.), while a vertical axis represents the stress (MPa). In FIG. 1, the inorganic film is a silicon oxynitride film (SiON). There are six kinds of inorganic films (In the inorganic films, O/(O+N) is in the range of equal to or greater than 0 to equal to or less than 1) illustrated in FIG. 1, in which compositions of oxygen (O) and nitrogen (N) are changed (in FIG. 1, the inorganic films are (a):O/(O+N)=0.99, (b):O/(O+N)=0.96, (c):O/(O+N)=0.57, (d):O/(O+N)=0.77, (e):O/(O+N)=0.35, and (f):O/(O+N)=0.63, respectively).

Figure 20:
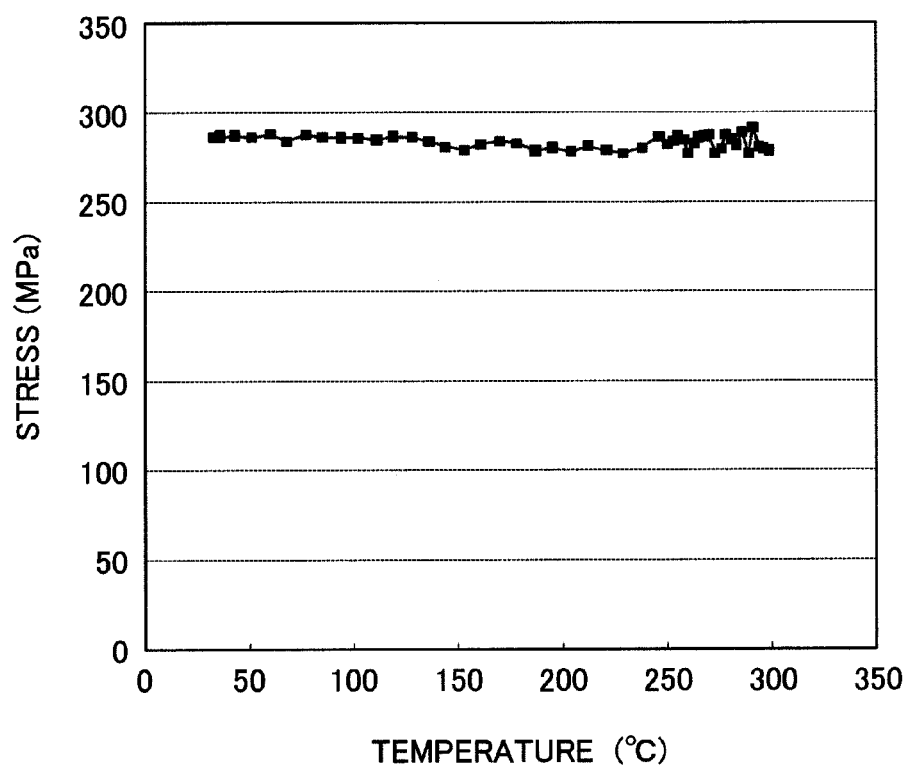
FIG. 20 is a graph showing a relationship between a temperature and a stress of the inorganic film, the temperature being increased from a room temperature after the inorganic film is formed on an upper surface of a substrate formed of silicon (Si) at 380° C., the stress being generated on the inorganic film when the temperature is increased.

In FIG. 1, each of the inorganic films (a), (b), (c), (d), (e), and (f) has a tendency that, as the temperature increases, the stress becomes larger. This tendency is one of the characteristics of the inorganic film which is formed at the room temperature (20° C. to 80° C.). In contrast to this, in a case of an inorganic film which is formed at high temperature, it is known that even if the temperature is increased, the stress hardly changes (see FIG. 20, FIG. 20 being a graph showing a relationship between a temperature and a stress of an inorganic film, the temperature being increased from the room temperature after the inorganic film is formed on an upper surface of a substrate formed of silicon (Si) at 380° C., the stress being generated on the inorganic film when the temperature is increased).

Further, in the graph shown in FIG. 1, a glass transition point (Tg) of the resin (polybenzoxazole) forming the resin member on which the inorganic film IOL is to be formed is represented as Tg in the horizontal axis.

In this case, as illustrated in FIG. 1, when the temperature is in a range of, for example, 0° C. to 300° C., the stress generated on the inorganic film is desired to be in a range A of about −360 MPa to 160 MPa. When the stress deviates from the range A, that is, when the stress generated on the inorganic film is smaller than −360 MPa, a wrinkle is liable to be generated in the inorganic film, while when the stress generated on the inorganic film is larger than 160 MPa, a crack is liable to be generated in the inorganic film.

In this case, in the temperature range of 0° C. to 300° C., inorganic films having stresses within the range A of equal to or higher than −360 MPa to equal to or lower than 160 MPa are the inorganic films shown as (a), (b), and (c) in FIG. 1. Therefore, when the inorganic film is a silicon oxynitride film (SiON), as shown in (a), (b), and (c) in FIG. 1, "O/(O+N)" is preferred to be in a range of 0.57 to 0.99. Further, as shown in the graph of FIG. 1, at the glass transition point (Tg, 280° C. in FIG. 1) of the resin member on which the inorganic film is to be formed, the stress acting on each of the inorganic films shown as (a), (b), and (c) in FIG. 1 is in the range of equal to or higher than −300 MPa to equal to or lower than 200 MPa. In this case, it is most preferred that the stress acting on the inorganic film at Tg be 0 MPa. However, it is apparent that neither a crack nor a wrinkle is generated in the inorganic film if the stress acting thereon is within the range of a width described above (in the range of equal to or higher than −300 MPa to equal to or lower than 200 MPa).

Figure 13:
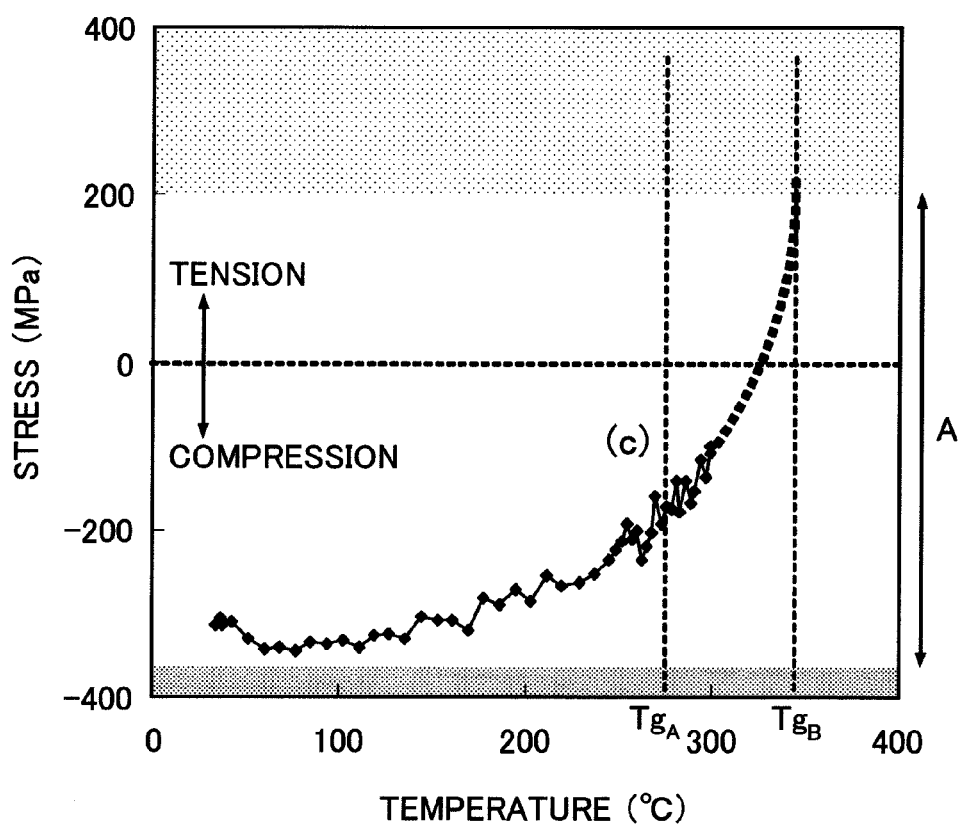
FIG. 13 is a graph showing a relationship between a stress acting on the inorganic film and the glass transition point of the resin forming the resin member, in forming the inorganic film included in the image display device illustrated in FIG. 2.

By the way, for example, whether or not the inorganic film having the characteristic of (c) of FIG. 1 is suitable for being formed on the resin member may be determined by the stress acting on the inorganic film at the glass transition point (Tg) of the resin member. FIG. 13 is a graph showing merely the inorganic film having the characteristic of (c) of FIG. 1. In a horizontal axis of FIG. 13, there are shown, in addition to a glass transition point $Tg_A$ which has the same value as the glass transition point Tg shown in FIG. 1, a glass transition point $Tg_B$ ($>Tg_A$) which has a larger value than the glass transition point $Tg_A$. In this case, the stress acting on the inorganic film having the characteristic of (c) of FIG. 1 at the glass transition point $Tg_B$ is equal to or higher than 200 MPa, and hence there is a risk that a crack is generated. Therefore, it is understood that the inorganic film having the characteristic of (c) of FIG. 1 is not suitable for being formed on the resin member having the glass transition point $Tg_B$.

Referring back to FIG. 1, in a case where the glass transition point of the resin member is Tg (=280° C.), the inorganic films shown as (a), (b), and (c) in FIG. 1 are inorganic films which can prevent generation of a crack or a wrinkle. Here, it is found that, when each of the inorganic films shown as (a), (b), and (c) in FIG. 1 is formed at the room temperature (20° C. to 80° C.), the stress acting on each of the inorganic films is in the range of equal to or higher than −400 MPa to equal to or lower than 50 MPa. Accordingly, in a case where the inorganic films are formed at the room temperature (20° C. to 80° C.), if the stress acting on each of the inorganic films at the room temperature is in the above-mentioned range of −400 MPa or higher to 50 MPa or lower, the inorganic films having the characteristics of (a), (b), and (c) of FIG. 1 may be formed. In this manner, it is understood that a crack and a wrinkle may be prevented from being generated in the inorganic film.

Figure 14:
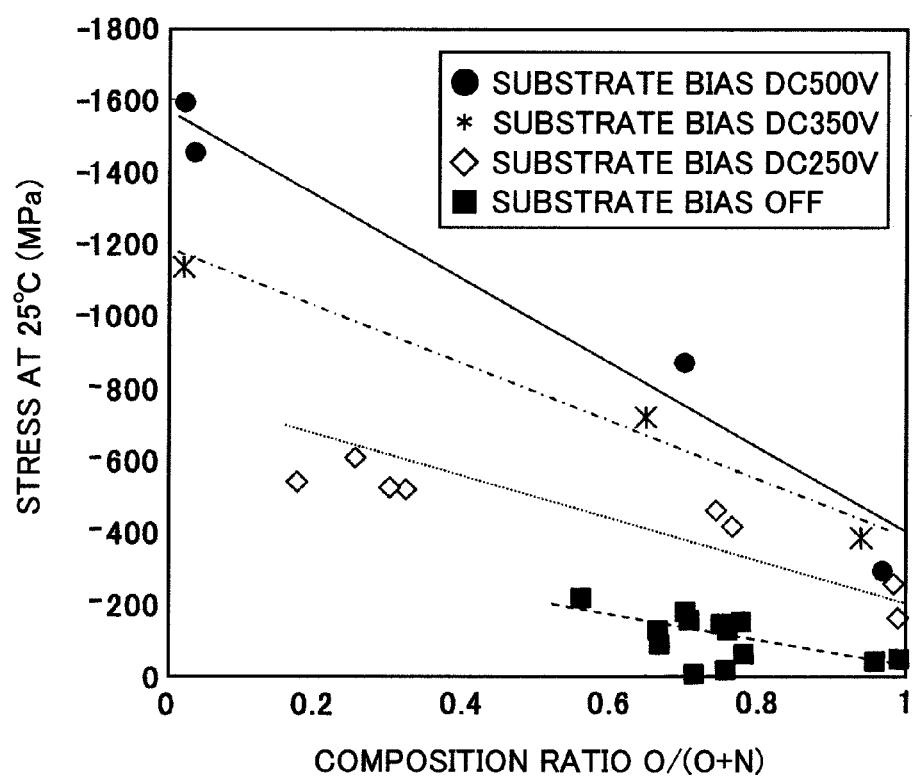
FIG. 14 is a graph showing a relationship between a composition of the inorganic film included in the image display device illustrated in FIG. 2 and a stress acting on the inorganic film which is formed at a room temperature.

FIG. 14 is a graph showing a relationship between a composition ratio (O/(O+N)) of the inorganic film and the stress acting thereon in a case where the inorganic film is formed at the room temperature (for example, 25° C.). In the inductively coupled plasma CVD apparatus 200 illustrated in FIG. 12, by setting a substrate bias at a predetermined value, an inorganic film having a desired composition ratio may be obtained. Accordingly, by setting the substrate bias of the inductively coupled plasma CVD apparatus 200, the stress acting on the inorganic film when the inorganic film is formed at the room temperature is adjusted to the above-mentioned range (in the range of equal to or higher than −400 MPa to equal to or lower than 50 MPa). In this manner, at the glass transition point (Tg) of the resin member, a stress close to 0 (for example, in the range of equal to or higher than −300 MPa to equal to or lower than 200 MPa) may act on the inorganic film.

As described above, by forming the inorganic film IOL described above on the upper surface of the resin member, a crack or a wrinkle may be prevented from being generated in the inorganic film IOL, and further, also in a case where the buffer layer BFL is formed on the upper surface of the inorganic film IOL, it is possible to prevent a crack or a wrinkle from being generated in the buffer layer BFL. In this manner, a TFT circuit layer which is excellent in reliability may be obtained.

1.4. Overall View of Image Display Device (Liquid Crystal Display Device)

Figure 15:
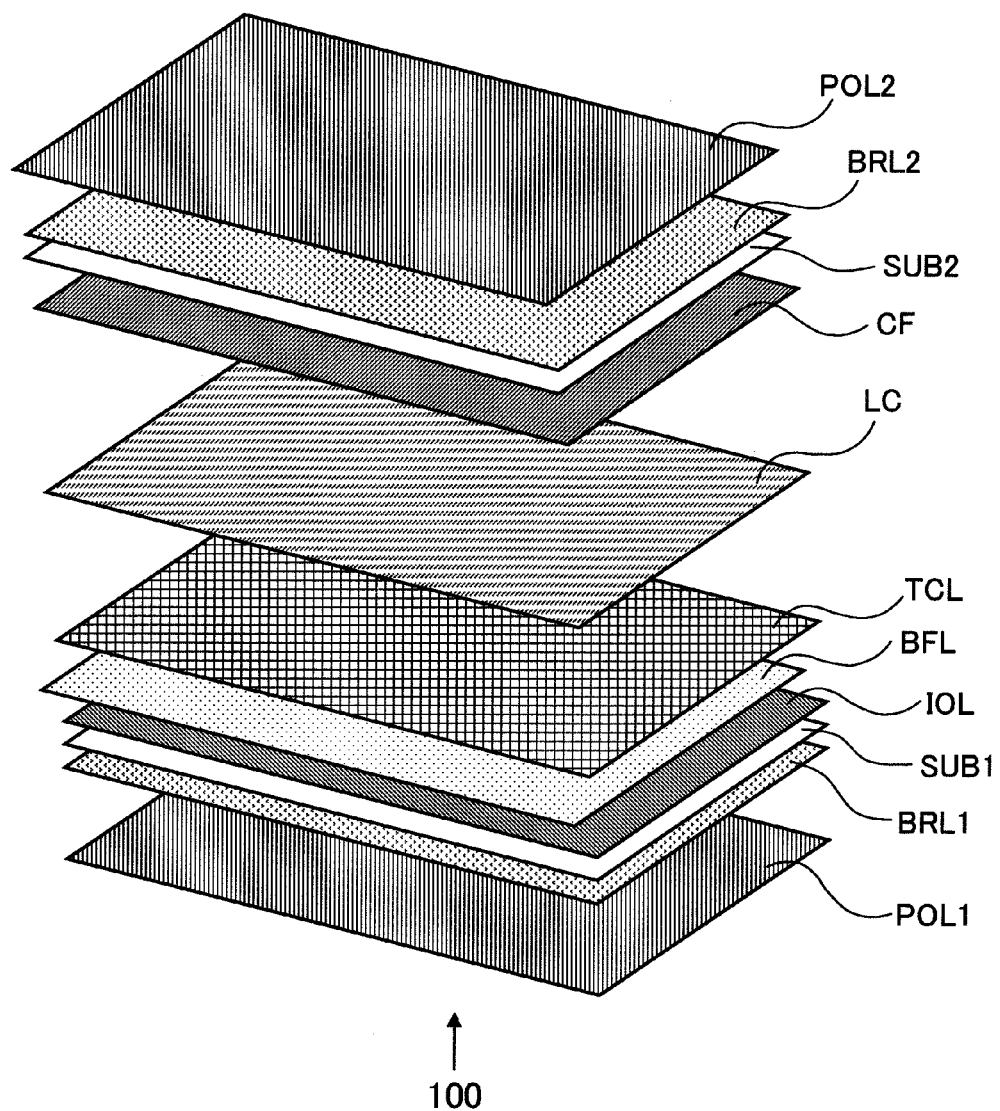
FIG. 15 is a schematic view illustrating an overall structure of a liquid crystal display device, which is an example of the image display device according to the first embodiment of the present invention.

FIG. 15 is a perspective exploded view of an overall structure of the image display device (liquid crystal display device) according to this embodiment. The liquid crystal display device 100 includes the first substrate SUB1 and the second substrate SUB2 which are disposed so as to be opposed to each other with liquid crystal LC being sandwiched therebetween. The inorganic film IOL is formed on the surface of the first substrate SUB1 on the liquid crystal LC side. The TFT circuit layer TCL is formed above the upper surface of the inorganic film IOL through intermediation of the buffer layer BFL. Although not illustrated, an alignment film is formed on the upper surface of the TFT circuit layer TCL, the alignment film being in direct contact with the liquid crystal. The alignment film is a film for determining an initial alignment direction of liquid crystal molecules. Further, a first polarizing plate POL1 is formed below the surface of the first substrate SUB1 on a side opposed to the liquid crystal LC, through intermediation of a first barrier layer BRL1. The first barrier layer BRL1 prevents moisture from penetrating the first substrate SUB1 from outside. The first polarizing plate POL1 (and also a second polarizing plate POL2 described later) is formed so as to visualize the behavior of the liquid crystal. A color filter CF is formed on the surface of the second substrate SUB2 on the liquid crystal LC side. In the color filter CF, respective colors of red, green, and blue are assigned to, for example, three pixels adjacent to one another, and the three pixels constitute a unit pixel for color display. On an upper surface of the color filter CF, although not illustrated, an alignment film which is in direct contact with the liquid crystal LC is formed. Further, above a surface of the second substrate SUB2 on a side opposed to the liquid crystal, the second polarizing plate POL2 is formed through intermediation of a second barrier layer BRL2.

Note that, the liquid crystal display device 100 illustrated in FIG. 15 is applicable to any type of liquid crystal display devices, such as an IPS type, VA type, and TN type liquid crystal display devices. Further, in FIG. 15, the liquid crystal display device 100 is exemplified as an image display device according to this embodiment. However, the image display device according to this embodiment may be applicable to other image display devices such as an organic electroluminescence (EL) display device. This is because, although the organic EL display device uses a self-emitting organic EL element as a pixel thereof, there is a case where a TFT circuit layer is formed on an upper surface of a resin substrate, and hence the organic EL display device suffers from similar problems to the liquid crystal display device.

2. Second Embodiment

Figure 16:
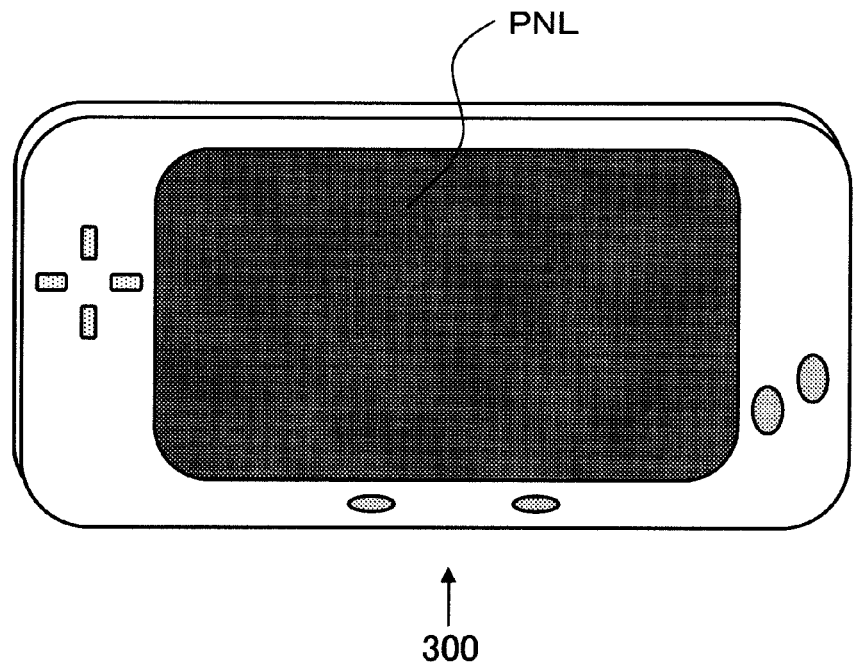
FIG. 16 is a diagram illustrating a portable game machine according to a second embodiment of the present invention, the portable game machine including the image display device according to the first embodiment of the present invention.

FIG. 16 illustrates a portable game machine 300 to which an image display device (panel) PNL according to the present invention is applied. As the image display device PNL, the liquid crystal display device 100 according to the first embodiment or the organic EL display device described above may be used. The image display device PNL illustrated in FIG. 16 is not curved, but the image display device PNL may be curved. The substrate used in the image display device PNL is formed of a resin, and hence the image display device PNL is light in weight and has excellent impact resistance.

3. Third Embodiment

Figure 17:
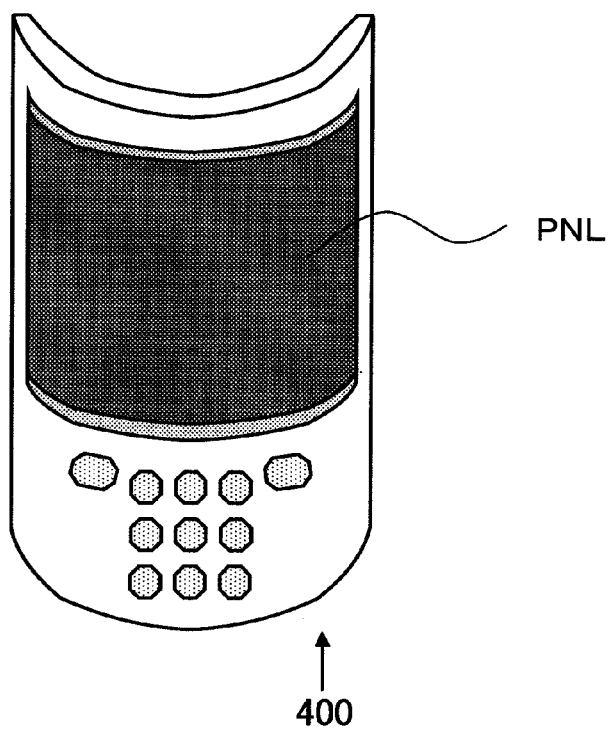
FIG. 17 is a diagram illustrating a mobile terminal according to a third embodiment of the present invention, the mobile terminal including the image display device according to the first embodiment of the present invention.

FIG. 17 illustrates a mobile terminal 400 to which the image display device (panel) PNL according to the present invention is applied. As the image display device PNL, the liquid crystal display device 100 according to the first embodiment or the organic EL display device described above may be used. The image display device PNL illustrated in FIG. 17 is curved, but the image display device PNL may not be curved.

4. Fourth Embodiment

Figure 18:
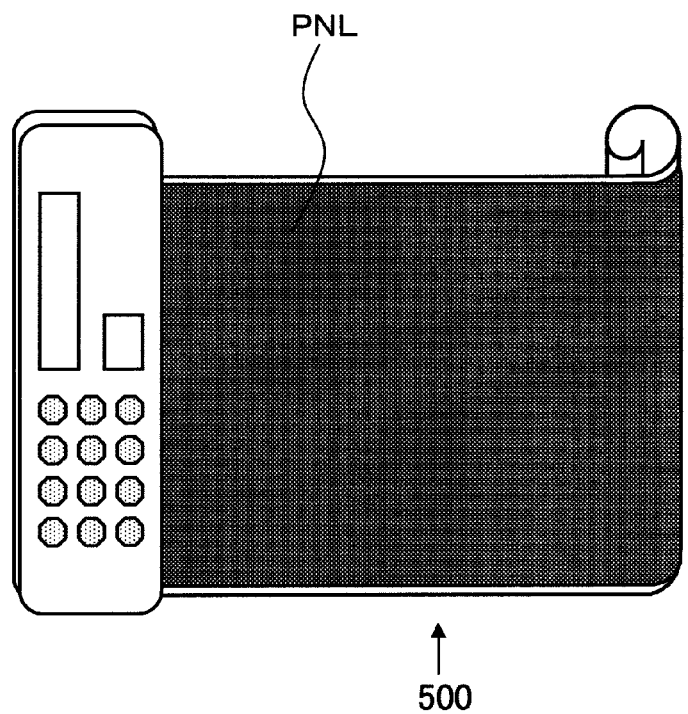
FIG. 18 is a diagram illustrating a rollable TV according to a fourth embodiment of the present invention, the rollable TV including the image display device according to the first embodiment of the present invention.

FIG. 18 illustrates a so-called rollable TV 500 which is foldable, to which the image display device (panel) PNL according to the present invention is applied. As the image display device PNL, the liquid crystal display device 100 according to the first embodiment or the organic EL display device described above may be used.

5. Fifth Embodiment

Figure 19:
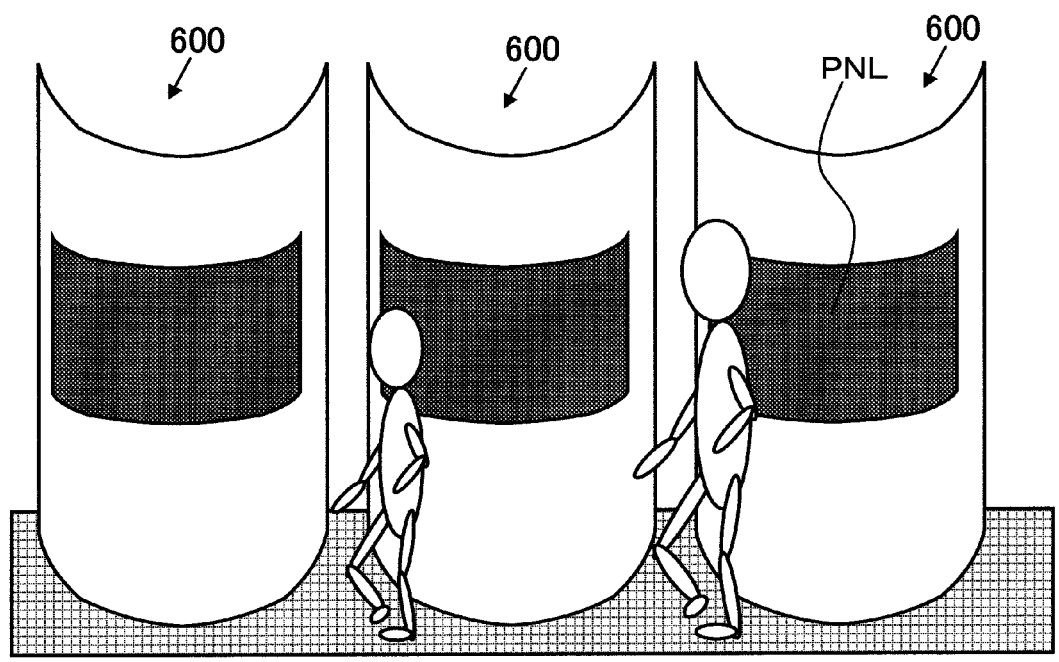
FIG. 19 is a diagram illustrating an electronic advertising device according to a fifth embodiment of the present invention, the electronic advertising device including the image display device according to the first embodiment of the present invention.

FIG. 19 illustrates an electronic advertising device 600 to which the image display device (panel) PNL according to the present invention is applied. As the image display device PNL, the liquid crystal display device 100 according to the first embodiment or the organic EL display device described above may be used. The image display device PNL illustrated in FIG. 19 is curved, but the image display device PNL may not be curved.

Hereinabove, the present invention has been described with reference to the embodiments. However, the structures of the embodiments described above are given as mere examples, and hence the present invention may be appropriately modified within the scope that does not depart from the technical idea thereof. Further, the structures of the embodiments described above may be adopted in combination unless the structures are contradictory to each other.

What is claimed is:

1. An image display device, comprising:
a resin member;
a TFT circuit layer formed above the resin member; and
an inorganic film formed on a surface of the resin member to be formed between the resin member and the TFT circuit layer,
wherein the image display device is configured so that the inorganic film has a stress acting thereon, and the inorganic film has a configuration so that the stress, at a glass transition point (Tg) of the resin member, is in a range of equal to or higher than −300 MPa to equal to or lower than 200 MPa, and at a room temperature, is in a range of equal to or higher than −400 MPa to equal to or lower than 50 MPa, so as to substantially prevent occurrence of at least one of a crack and a wrinkle of the inorganic film.

2. The image display device according to claim 1, wherein the inorganic film comprises a film selected from the group consisting of a silicon oxynitride film, a silicon oxide film, a silicon nitride film, a metal film, a semi-metal film, a metal oxynitride film, a metal oxide film, and a metal nitride film, or a laminate thereof.

3. The image display device according to claim 1, wherein the room temperature comprises a temperature in a range of 20° C. to 80° C.

4. The image display device according to claim 1, further comprising a buffer layer formed between the inorganic film and the TFT circuit layer.

5. The image display device according to claim 1, wherein the image display device comprises a liquid crystal display device.

6. The image display device according to claim 1, wherein the image display device comprises an organic EL display device.

* * * * *